United States Patent
Zhu et al.

(10) Patent No.: US 7,898,021 B2
(45) Date of Patent: Mar. 1, 2011

(54) SEMICONDUCTOR FIN BASED NONVOLATILE MEMORY DEVICE AND METHOD FOR FABRICATION THEREOF

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 591 days.

(21) Appl. No.: 11/924,699

(22) Filed: Oct. 26, 2007

(65) Prior Publication Data
US 2009/0108324 A1    Apr. 30, 2009

(51) Int. Cl.
*H01L 29/792* (2006.01)
(52) U.S. Cl. .................................. 257/324; 257/316
(58) Field of Classification Search .............. 257/324, 257/316
See application file for complete search history.

(56) References Cited

U.S. PATENT DOCUMENTS 6,445,032 B1    9/2002    Kumar et al.
6,903,967 B2 *  6/2005    Mathew et al. .............. 365/177
6,933,558 B2    8/2005    Hill et al.
6,963,104 B2    11/2005   Wu et al.
7,087,952 B2    8/2006    Zhu et al.

OTHER PUBLICATIONS

Kumar et al., "Scaling of Flash NVRAM to 10's of nm by Decoupling of Storage From Read/Sense Using Back-Floating Gates," IEEE Transactions on Nanotechnology, vol. 1, No. 4, Dec. 2002, pp. 247-254.

* cited by examiner

*Primary Examiner*—Douglas M Menz
(74) *Attorney, Agent, or Firm*—Scully, Scott, Murphy & Presser, P.C.; H. Daniel Schnurmann

(57) ABSTRACT

A semiconductor structure and a method for fabricating the semiconductor structure include a semiconductor fin having a first side and a second side opposite the first side. A first gate dielectric and a charge storage layer are successively layered upon the first side of the semiconductor fin. A second gate dielectric and a gate electrode are layered upon the second side and the charge storage layer. The semiconductor structure comprises a nonvolatile semiconductor device.

8 Claims, 8 Drawing Sheets

SEMICONDUCTOR FIN BASED NONVOLATILE MEMORY DEVICE AND METHOD FOR FABRICATION THEREOF

BACKGROUND

1. Field of the Invention

The invention relates generally to semiconductor devices and semiconductor device structures. More particularly, the invention relates to nonvolatile semiconductor devices and semiconductor device structures.

2. Description of the Related Art

Semiconductor circuits include semiconductor devices and semiconductor structures that are formed within and upon a semiconductor substrate. Such semiconductor devices may include, but are not necessarily limited to active semiconductor devices and passive semiconductor devices. Active semiconductor devices include, but are not necessarily limited to transistors and diodes. Passive semiconductor devices may include, but are not necessarily limited to, resistors and capacitors. The semiconductor devices, whether active semiconductor devices or passive semiconductor devices, are connected and interconnected using patterned conductor layers that are separated by dielectric layers.

As semiconductor technology has advanced, the development and implementation of novel semiconductor devices and semiconductor structures within semiconductor circuits has also evolved. In particular with respect to data storage semiconductor devices, recent advances in semiconductor technology have included the development and implementation of nonvolatile semiconductor devices. Nonvolatile semiconductor devices are typically transistor based devices that allow for charge storage independent of a supply of electrical power to the nonvolatile semiconductor device. Nonvolatile semiconductor devices and nonvolatile semiconductor device structures are desirable insofar as nonvolatile semiconductor devices generally allow for portability of data independent of supply of power. To that end nonvolatile devices find common use within apparatus such as but not limited to digital cameras and flash drives.

Various nonvolatile semiconductor devices and nonvolatile semiconductor device structures are known in the semiconductor fabrication art.

For example, Kumar et al., in "Scaling of Flash NVRAM to 10's of nm by Decoupling of Storage From Read/Sense Using Back-Floating Gates," IEEE Trans. on Nanotechnology, Vol. 1(4), December 2002, teaches a back-floating gate NVRAM structure which in-part allows for decoupling of read/sensing from storage/programming.

In addition, Kumar et al., in U.S. Pat. No. 6,445,032, teaches an electrically erasable programmable read only memory (EEPROM) device with enhanced performance. The EEPROM device realizes the foregoing object by including a back plane that allows for multiple gate dielectric thicknesses within the EEPROM device.

Further, Hill et al., in U.S. Pat. No. 6,933,588, teaches a flash memory device that has enhanced performance. The flash memory device uses a cylindrical core member.

Still further, Wu et al., in U.S. Pat. No. 6,963,104 teaches a nonvolatile memory device with enhanced data retention. The nonvolatile memory device comprises a fin based nonvolatile memory device.

Finally, Zhu et al., in U.S. Pat. No. 7,087,952, teaches a dual function logic and memory device with enhanced space efficiency. The dual function logic and memory device is predicated upon the use of a single semiconductor fin.

Nonvolatile semiconductor devices are likely to be of considerable continued importance and interest as semiconductor technology advances. Thus, desirable are nonvolatile semiconductor devices and nonvolatile semiconductor device structures, as well as methods for fabricating those nonvolatile semiconductor devices and nonvolatile semiconductor device structures.

SUMMARY

The invention includes a semiconductor structure and a method for fabricating the semiconductor structure. The semiconductor structure includes a nonvolatile semiconductor device structure that includes a semiconductor fin located over a substrate and having a first side opposite a second side. A first gate dielectric and a charge storage layer are successively layered upon the first side of the semiconductor fin. A second gate dielectric and a gate electrode are successively layered upon the second side and the charge storage layer. Thus, a semiconductor structure in accordance with the invention includes a semiconductor fin based structure that provides for non-volatile data storage.

A semiconductor structure in accordance with the invention includes a semiconductor fin located over a substrate and having a first side and a second side opposite the first side. The semiconductor structure also includes a first gate dielectric located upon the first side of the semiconductor fin and a charge storage layer located upon the first gate dielectric. The semiconductor structure also includes a second gate dielectric located upon both the second side of the semiconductor fin and the charge storage layer, and a gate electrode located upon the second gate dielectric.

Another semiconductor structure in accordance with the invention includes a semiconductor fin including a buffer layer located aligned upon the semiconductor fin over a substrate and having a first side and a second side opposite the first side. This other semiconductor structure also includes a first gate dielectric located upon the first side of the semiconductor fin and a charge storage layer located upon the first gate dielectric. This other semiconductor structure also includes a second gate dielectric located upon both the second side of the semiconductor fin and the charge storage layer, and a gate electrode located upon the second gate dielectric.

A method for fabricating a semiconductor structure in accordance with the invention includes layering upon a first side of a semiconductor fin located over a substrate but not upon a second side of the semiconductor fin opposite the first side of the semiconductor fin a first gate dielectric, and a charge storage layer upon the first gate dielectric. This particular method also includes layering upon the second side of the semiconductor fin located over the substrate, and also upon the charge storage layer, a second gate dielectric, and a gate electrode upon the second gate dielectric.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a semiconductor structure and a method for fabricating the semiconductor structure, is understood within the context of the Description of the Preferred Embodiment, as set forth below. The Description of the Preferred Embodiment is understood within the context of the drawings described above. Since the drawings are intended for illustrative purposes, the drawings are not necessarily drawn to scale.

Figure 1:
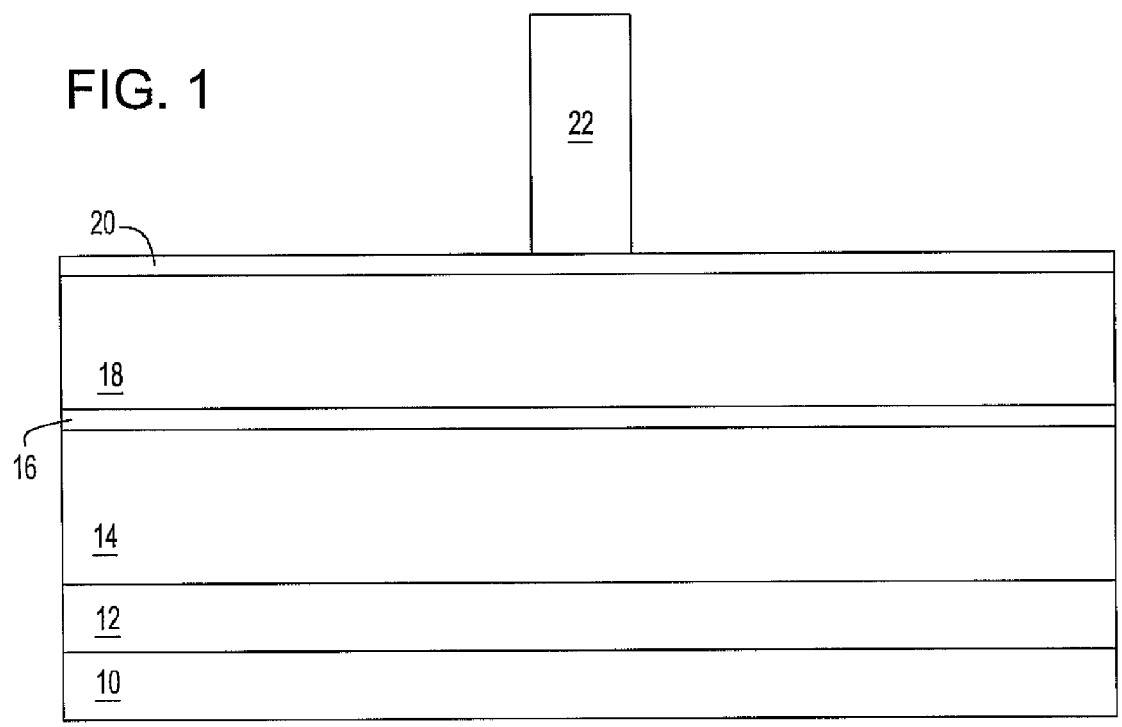
FIG. 1 to FIG. 11C show a series of schematic cross-sectional diagrams illustrating the results of progressive stages in fabricating a semiconductor structure in accordance with a particular embodiment of the invention.

FIG. 1 to FIG. 11C show a series of schematic cross-sectional diagrams illustrating the results of progressive stages in fabricating a semiconductor structure in accordance with a particular embodiment of the invention. This particular embodiment of the invention comprises a preferred embodiment of the invention. FIG. 1 shows a schematic cross-sectional diagram of the semiconductor structure at an early stage in the fabrication thereof in accordance with this particular preferred embodiment.

FIG. 1 shows a base semiconductor substrate 10. A buried dielectric layer 12 is located upon the base semiconductor substrate 10. A surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 1 to about 3 millimeters.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectrics often being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the semiconductor substrate 10. Typically, the buried dielectric layer 12 has a thickness from about 50 to about 300 nanometers.

The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition, dopant concentration and crystallographic orientation. Typically, the surface semiconductor layer 14 has a thickness from about 30 to about 100 nanometers.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Although this particular disclosed embodiment illustrates the invention within the context of a semiconductor-on-insulator substrate comprising in layered sequence the base semiconductor substrate 10, the buried dielectric layer 12 and the surface semiconductor layer 14, neither the embodiment, nor the invention, is necessarily intended to be so limited. Rather, the present invention may alternatively be practiced under certain limited circumstances using a bulk semiconductor substrate (that would otherwise result from absence of the buried dielectric layer 12 under circumstances where the base semiconductor substrate 10 and the surface semiconductor layer 14 have identical chemical composition and crystallographic orientation).

FIG. 1 also shows sequentially layered upon the surface semiconductor layer 14: (1) a first capping layer 16; (2) a buffer layer 18; and (3) a second capping layer 20. Each of the first capping layer 16, the buffer layer 18 and the second capping layer 20 may comprise materials, have dimensions and be formed using methods that are otherwise generally conventional in the semiconductor fabrication art. Typically, each of the first capping layer 16, the buffer layer 18 and the second capping layer 20 will generally comprise a dielectric material, but the first capping layer 16 and the second capping layer 20 will typically comprise a different dielectric material in comparison with the buffer layer 18. Suitable dielectric materials for the first capping layer 16, the buffer layer 18 and the second capping layer 20 include oxides, nitrides and oxynitrides of silicon. Oxides, nitrides and oxynitrides of other elements are not excluded. Similarly, the first capping layer 16, the buffer layer 18 and the second capping layer 20 may be formed using any of several methods. Non-limiting examples include thermal or plasma oxidation or nitridation methods, chemical vapor deposition methods and physical vapor deposition methods. Typically, each of the first capping layer 16 and the second capping layer 20 comprises a silicon oxide capping material that has a thickness from about 5 to about 10 nanometers. Typically, the buffer layer 18 comprises a silicon nitride material that has a thickness from about 30 to about 50 nanometers.

Finally, FIG. 1 illustrates a photoresist layer 22 located nominally centered upon the second capping layer 20. The photoresist layer 22 may comprise any of several photoresist materials. Candidate photoresist materials include positive photoresist materials, negative photoresist materials and hybrid photoresist materials. Typically, the photoresist layer 22 comprises a positive photoresist material or a negative photoresist material that has a thickness from about 200 to about 500 nanometers.

Figure 2:
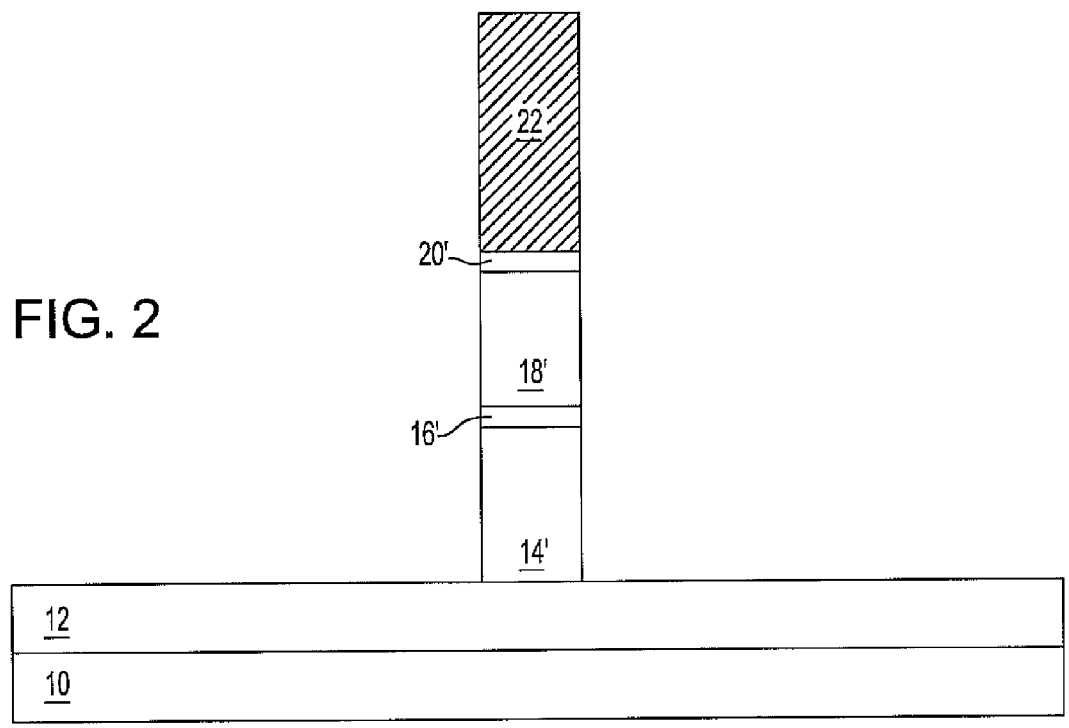

FIG. 2 shows the results of sequentially etching the second capping layer 20, the buffer layer 18, the first capping layer 16 and the surface semiconductor layer 14 to form a corresponding surface semiconductor layer 14', first capping layer 16', buffer layer 18' and second capping layer 20'. The foregoing sequential etching is typically effected using a plasma etch method that is otherwise generally conventional in the semiconductor fabrication art. While certain wet chemical etch methods may not be excluded, plasma etch methods desirably provide nominally straight sidewalls to the layered stack that comprises the second capping layer 20', the buffer layer 18', the first capping layer 16'; and the surface semiconductor layer 14'. Such a plasma etch method will typically use an etchant gas composition, or a series of etchant gas compositions, that is otherwise appropriate to the materials from which are comprised each of the foregoing individual layers. Generally, fluorine containing etchant gas compositions are typically used when etching silicon containing dielectric materials, while chlorine and/or bromine containing etchant gas compositions are typically used when etching silicon containing semiconductor materials.

Figure 3:
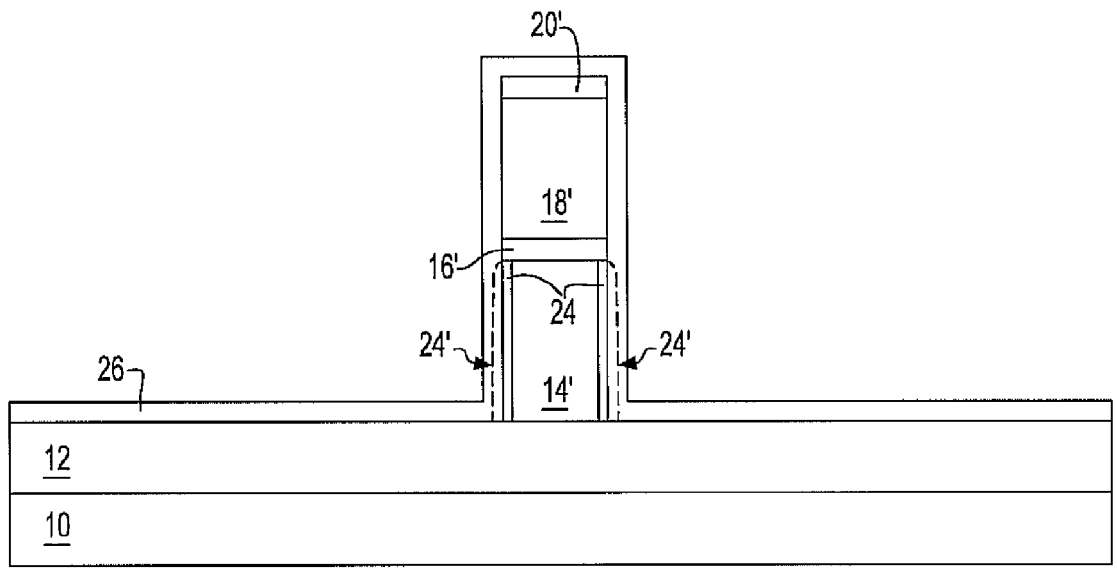

FIG. 3 first shows the results of stripping the photoresist layer 22 from the second capping layer 20' within the semiconductor structure whose schematic cross-sectional diagram is illustrated in FIG. 2. The photoresist layer 22 may be stripped from the second capping layer 20' within the semiconductor structure whose schematic cross-sectional diagram is illustrated in FIG. 2 to provide in part the semiconductor structure whose schematic cross-sectional diagram is illustrated in FIG. 3 while using photoresist stripping methods and materials that are otherwise generally conventional in the semiconductor fabrication art. Non-limiting examples include wet chemical stripping methods and dry plasma stripping methods, as well as aggregates of wet chemical stripping methods and dry plasma stripping methods.

FIG. 3 also shows a first gate dielectric 24 located upon the sidewalls of the semiconductor fin 14'. The first gate dielectric 24 may comprise a conventional dielectric material, such as an oxide, nitride or oxynitride of silicon that has a dielectric constant from about 4 to about 20, measured in vacuum. Alternatively, the first gate dielectric 24 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The first gate dielectric 24 may be formed using any of several methods that are appropriate to its material(s) of composition. Included, but not limiting are thermal or plasma oxidation or nitridation methods, chemical vapor deposition methods and physical vapor deposition methods. Typically, the first gate dielectric 24 comprises a thermal silicon oxide dielectric material that has a thickness from about 1 to about 10 nanometers, although the instant embodiment is not so limited.

Although the schematic cross-sectional diagram of FIG. 3 illustrates the first gate dielectric 24 as undercutting beneath the first capping layer 16', such is not a requirement of the embodiment, and under most circumstances such undercutting does not occur. When the first gate dielectric 24 comprises a thermal silicon oxide material, a minimal amount of the semiconductor fin 14' may be consumed when forming the thermal silicon oxide material. Such a thermal silicon oxide material will normally extend beyond the sidewall planes of the buffer layer 18'. Such an extension of the first gate dielectric 24 is illustrated by the phantom lines that correspond with reference numerals 24' within FIG. 3. When the first gate dielectric 24 comprises a deposited dielectric material, the first gate dielectric 24 is formed conformally upon exposed and nominally aligned sidewall surfaces of the second capping layer 20', the buffer layer 18', the first capping layer 16' and the semiconductor fin 14'. Subsequent drawing figures will illustrate the first gate dielectric 24 as recessed solely for the purposes of clarity in the drawings, although the first gate dielectric 24 is typically not recessed. As noted above, the drawings are not necessarily drawn to scale.

FIG. 3 finally shows a charge storage layer 26 located and formed upon the semiconductor structure of FIG. 2, after having: (1) stripped the photoresist layer 22 from the second capping layer 20'; and (2) formed the first gate dielectric 24 upon the sidewall of the semiconductor fin 14'. The charge storage layer 26 may comprise any of several sacrificial materials, but in particular the charge storage layer 26 comprises a sacrificial material that is susceptible to selective processing to provide etch selective portions to the charge storage layer 26. While the charge storage layer 26 may thus comprise any of several charge storage materials, such as but not limited to conductor materials, semiconductor materials and dielectric materials, most typically, the charge storage layer 26 comprises a dielectric material, such as but not limited to a silicon nitride dielectric material. Alternatively, a conductor material such as a polysilicon conductor material, such as a gate electrode material, may also be used for the charge storage layer 26. Dielectric charge storage materials are desirable insofar as they allow for storage of multiple bits of information. The charge storage layer 26 may be formed using any of several methods. Non-limiting methods include chemical vapor deposition methods and physical vapor deposition methods. Typically, the charge storage layer 26 has a thickness from about 5 to about 15 nanometers.

Figure 4:
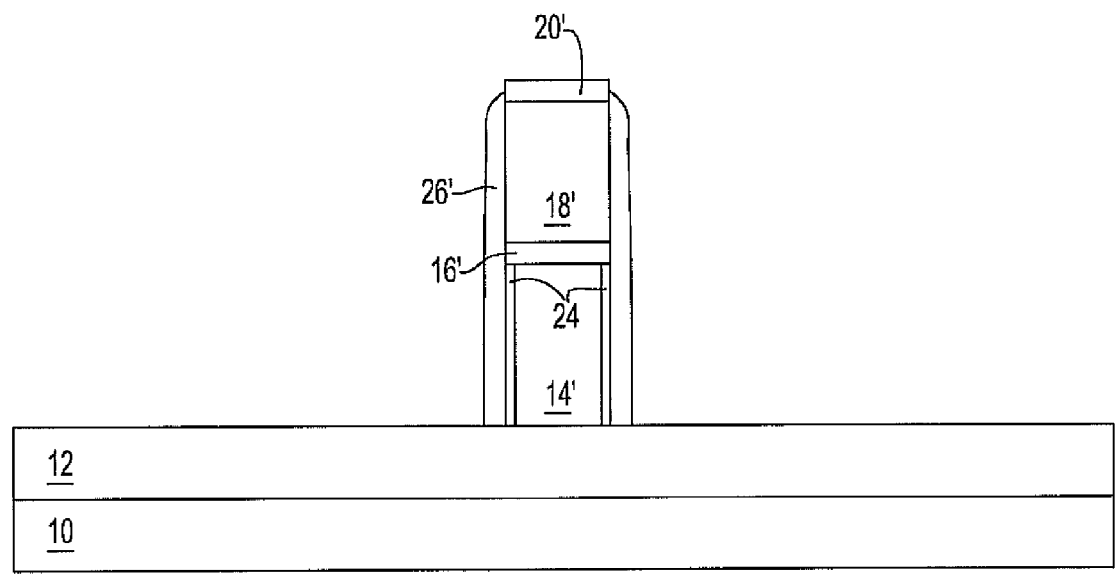

FIG. 4 shows the results of etching the charge storage layer 26 to form a charge storage spacer 26' that adjoins the sidewalls of the second capping layer 20', the buffer layer 18', the first capping layer 16' and the first gate dielectric 24. While FIG. 4 illustrates the charge storage spacer 26' as a plurality of layers, the charge storage spacer 26' is intended as a single layer that encircles the semiconductor fin 14' in plan-view. The foregoing anisotropic etching is otherwise generally conventional in the semiconductor fabrication art when forming the charge storage spacer 26' from the charge storage layer 26.

Figure 5:
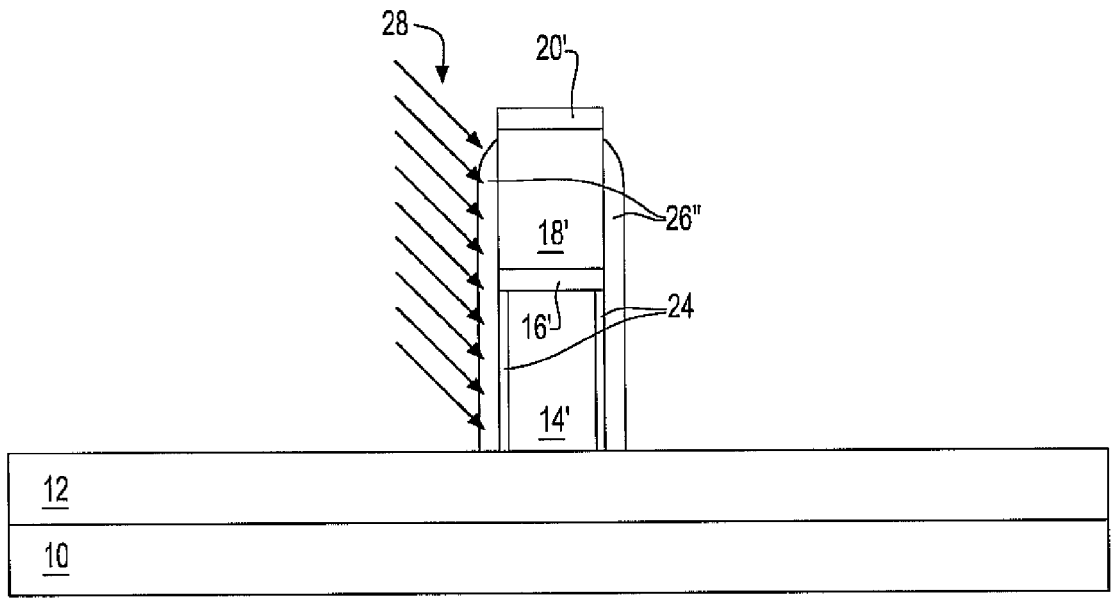

FIG. 5 shows the results of ion implanting the left hand portion of the charge storage spacer 26' to form a charge storage spacer 26", while using a dose of implanting ions 28. The implanting ions 28 are intended to be selected so as to modify the charge storage spacer 26' to form the charge storage spacer 26", and to provide an etch selectivity of the left hand portion of the charge storage spacer 26" to the right hand portion of the charge storage spacer 26". Within the context of the instant embodiment, when the charge storage spacer 26' comprises a silicon nitride material, the charge storage spacer 26' may be implanted with a germanium implanting ion 28 at a dose from about $10^{13}$ to about $10^{15}$ germanium ions per square centimeter and a germanium ion implantation energy from about 1 to about 20 keV, and also at an implant angle from about 15 to about 60 degrees to a normal to the base semiconductor substrate 10, to provide the charge storage spacer 26".

Figure 6:
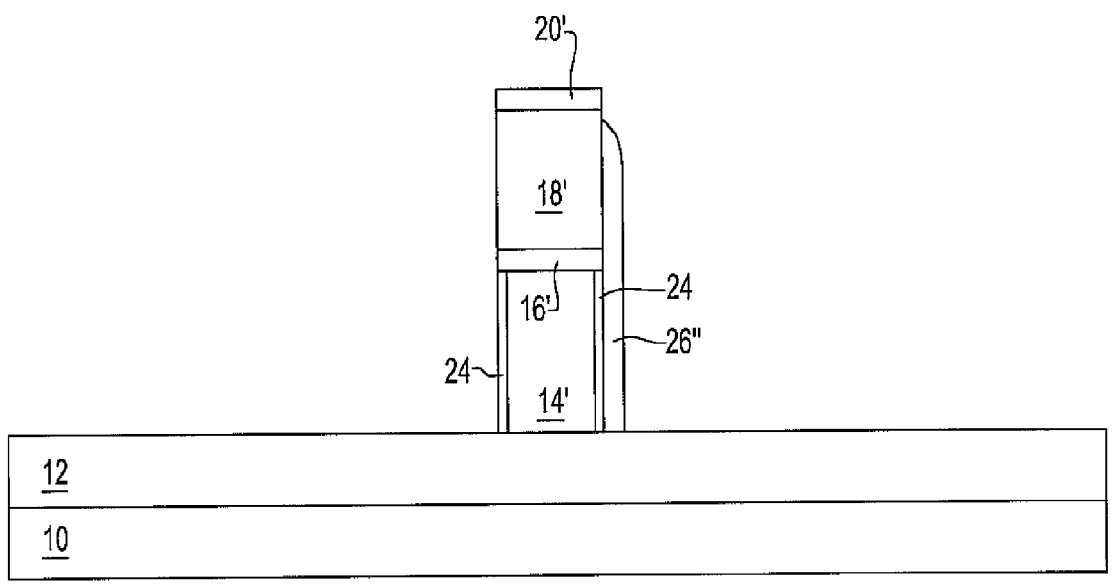

FIG. 6 shows the results of stripping a portion of the charge storage spacer 26" from the left hand side of the semiconductor structure that is illustrated in FIG. 5 to leave remaining the charge storage spacer 26" on the right hand side of the semiconductor structure whose schematic cross-sectional diagram is illustrated in FIG. 6. The foregoing stripping may be selectively effected insofar as the left hand side of the charge storage spacer 26" comprises a different chemical composition in comparison with the right hand side of the charge storage spacer 26". When the left hand side of the charge storage spacer 26" is ion implanted to form a silicon-germanium nitride material while the right hand side remains unimplanted as a silicon nitride material, the left hand portion of the charge storage spacer 26" may be etched selectively and stripped with respect to the right hand portion of the charge storage spacer 26" while using a wet chemical etchant that includes phosphoric acid at a temperature of about 150 to about 190 degrees centigrade.

Figure 7:
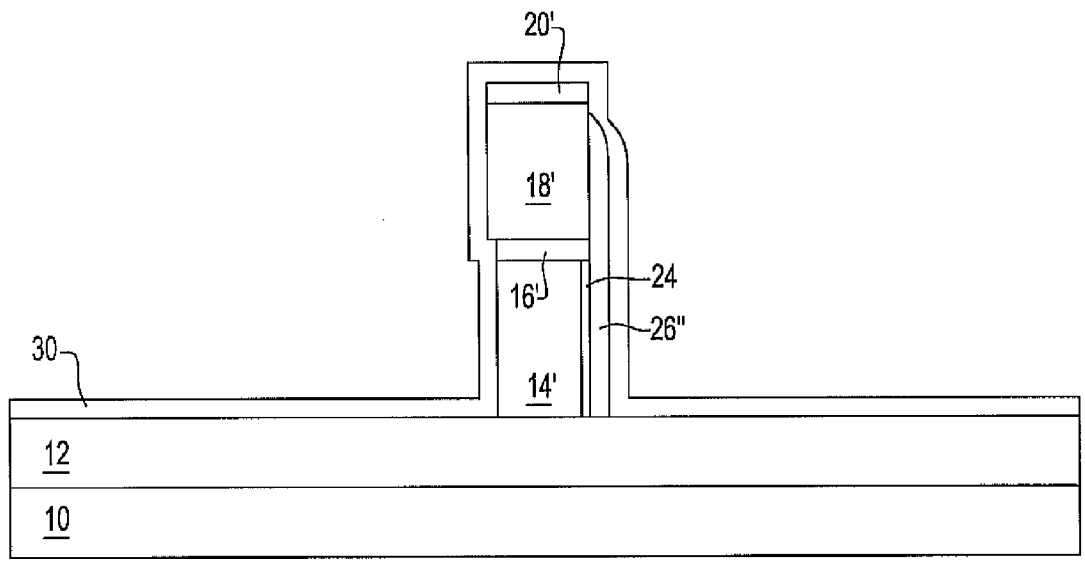

FIG. 7 first shows the results of stripping the first gate dielectric 24 from the left hand side of the semiconductor fin 14'. The first gate dielectric 24 may be stripped from the left hand side of the semiconductor fin 14' that is illustrated in FIG. 7 while using stripping methods and stripping materials that are otherwise generally conventional in the semiconductor fabrication art. Such stripping methods may include, but are not necessarily limited to, wet chemical stripping methods and dry plasma stripping methods. When the first gate dielectric 24 comprises a silicon oxide gate dielectric material, the first gate dielectric 24 may be stripped from the left hand side of the semiconductor fin 14' while using an aqueous hydrofluoric acid solution.

FIG. 7 also shows a second gate dielectric 30 located and formed upon the semiconductor structure of FIG. 6 after having stripped the first gate dielectric 24 from the left hand portion of the semiconductor fin 14'. The second gate dielectric 30 may comprise any of the several gate dielectric materials from which is comprised the first gate dielectric 24. The second gate dielectric 30 may comprise the same dielectric material or a different dielectric material in comparison with the first gate dielectric 24. Typically the second gate dielectric 30 comprises a generally higher dielectric constant dielectric material having a dielectric constant from about 8 to about 30, such as but not limited to a hafnium oxide dielectric material or a hafnium silicate dielectric material. Typically, the second gate dielectric 30 has a thickness from about 1 to about 5 nanometers.

Figure 8:
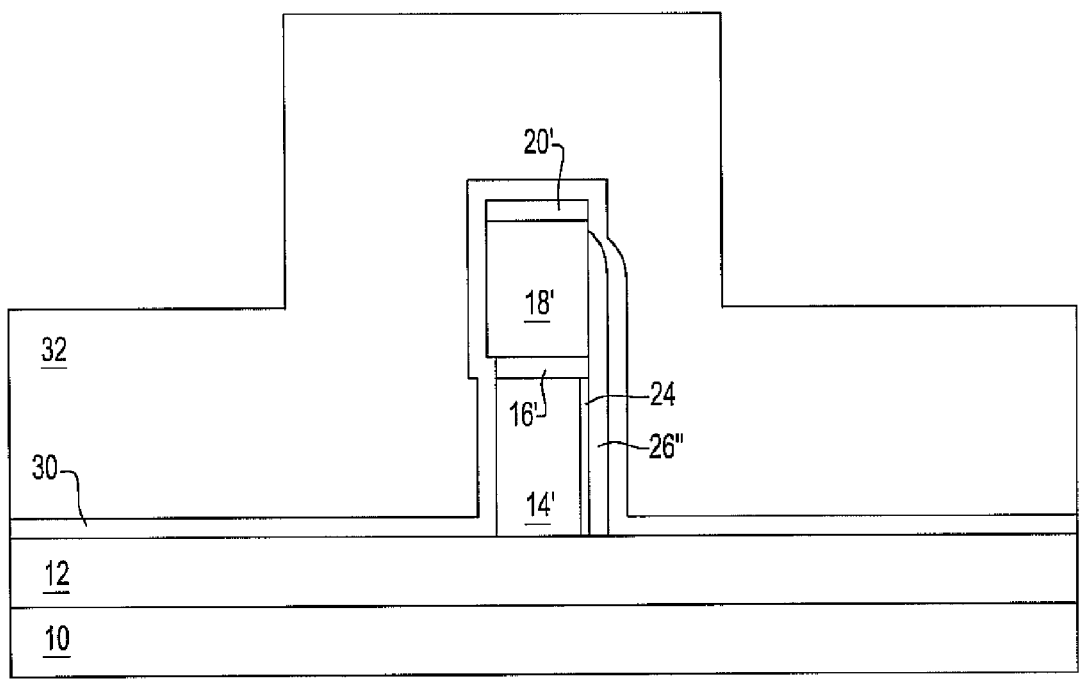

FIG. 8 shows a gate electrode material layer 32 located upon the semiconductor structure of FIG. 7, and in particular upon the second gate dielectric 30.

The gate electrode material layer 32 may comprise materials including but not limited to certain metals, metal alloys, metal nitrides and metal silicides, as well as laminates thereof and composites thereof. The gate electrode material layer 32 may also comprise doped polysilicon and polysilicon-germanium alloy materials (i.e., having a dopant concentration from about $10^{19}$ to about $10^{22}$ dopant atoms per cubic centimeter) and polycide materials (doped polysilicon/metal silicide stack materials). Similarly, the foregoing gate electrode materials may also be formed using any of several methods. Non-limiting examples include salicide methods, chemical vapor deposition methods and physical vapor deposition methods, such as, but not limited to evaporative methods and sputtering methods. Typically, the gate electrode material layer 32 comprises a doped polysilicon material that has a thickness from about 300 to about 1500 angstroms.

Figure 9A:
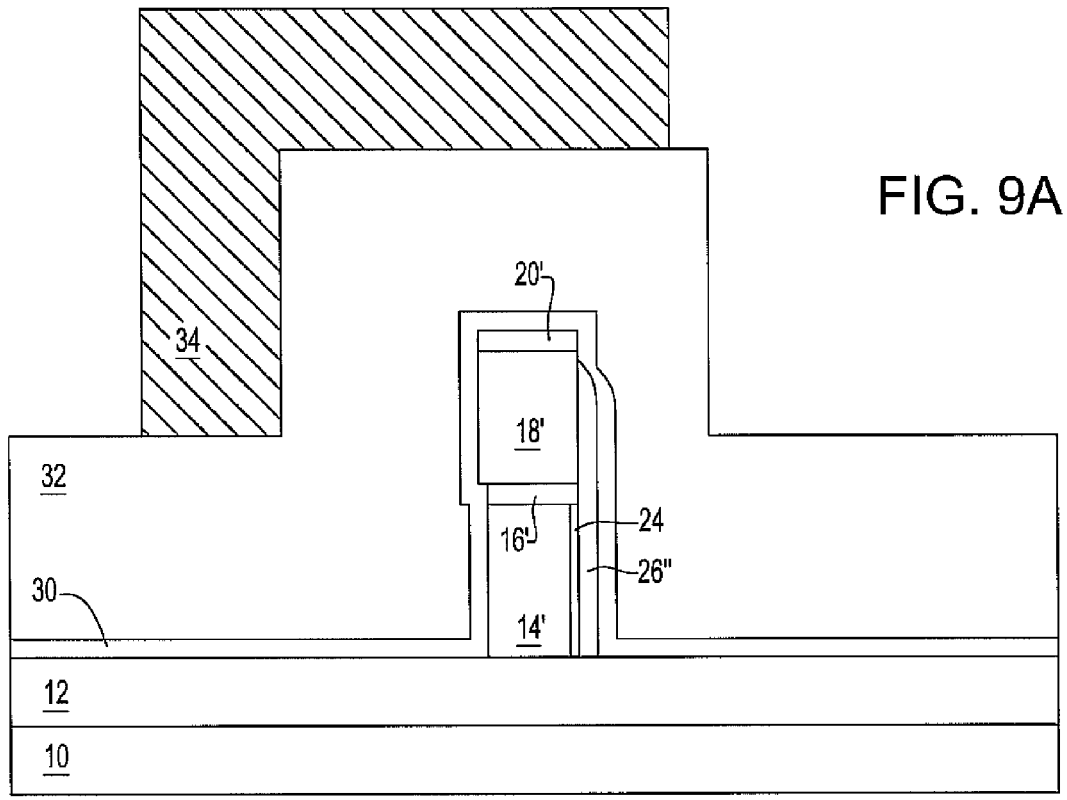

FIG. 9A shows a second photoresist layer 34 located and formed upon a left hand side of the semiconductor structure of FIG. 8. The second photoresist layer 34 is located upon the gate electrode material layer 32, and the second photoresist layer 34 may comprise any of the several photoresist materials from which is comprised the photoresist layer 22 that is illustrated in FIG. 1. Typically, the second photoresist layer 34 comprises a positive photoresist material or a negative photoresist material that has a thickness from about 200 to about 500 nanometers.

Figure 9B:
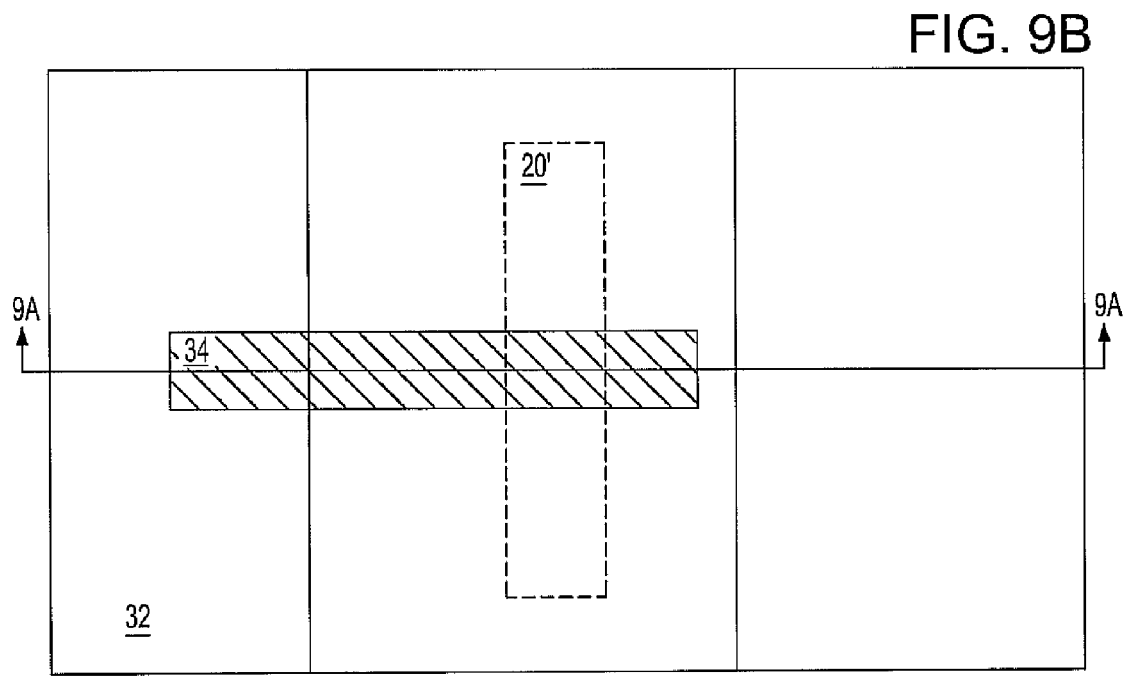

FIG. 9B shows a schematic plan-view diagram of a semiconductor structure corresponding with the semiconductor structure whose schematic cross-sectional diagram is illustrated in FIG. 9A. FIG. 9B shows the gate electrode material layer 32 with an outline of the second capping layer 20' located beneath the gate electrode material layer 32 and the second photoresist layer 34 located above the gate electrode material layer 32.

Figure 10A:
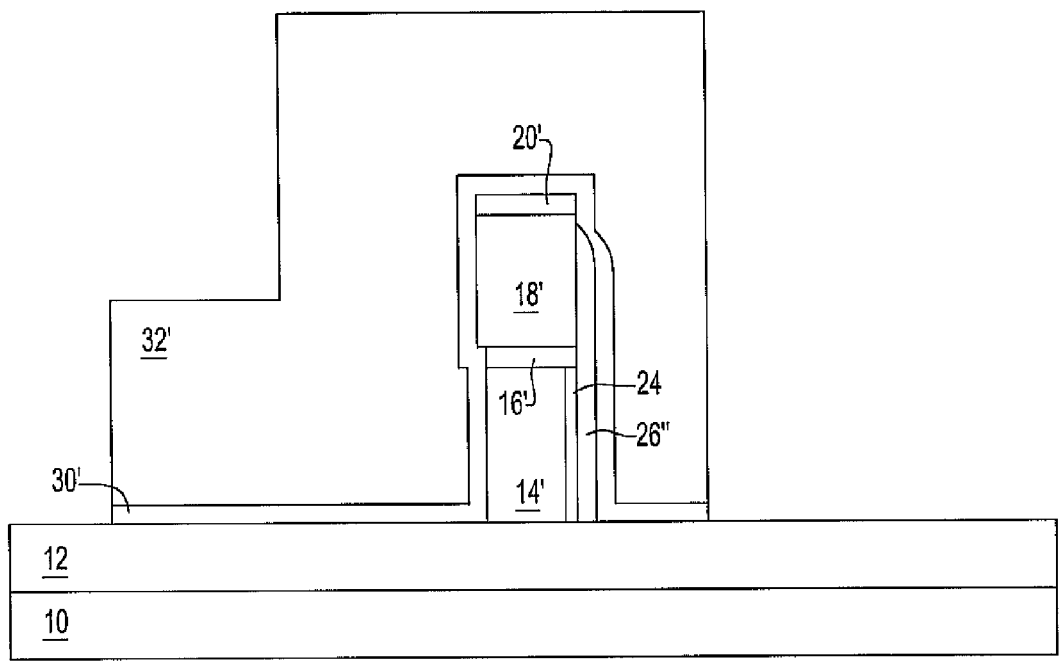

FIG. 10A shows the results of etching the gate electrode material layer 32 and the second gate dielectric 30 to form a gate electrode 32' located upon a second gate dielectric 30'. The foregoing etching may be effected using a plasma etch method that provides nominally straight sidewalls to the gate electrode 32' and second gate dielectric 30'.

Figure 10B:
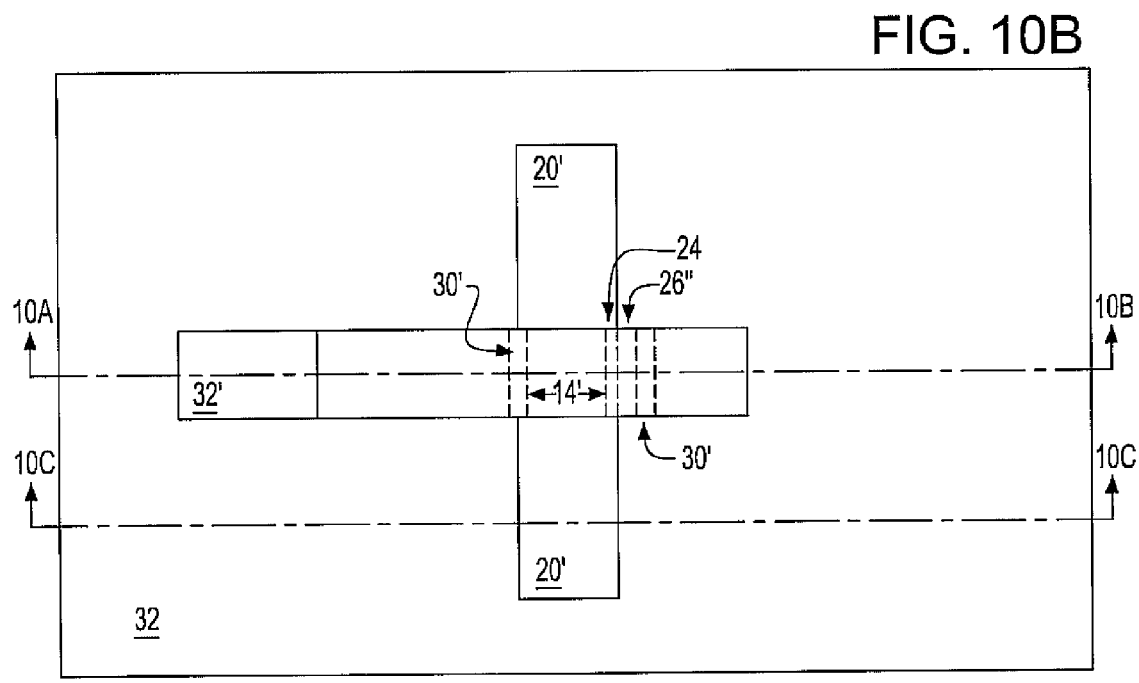

FIG. 10B shows a schematic plan-view diagram that corresponds with the schematic cross-sectional diagram of FIG. 10A. FIG. 10B shows the buried oxide layer 12. The second capping layer 20' is exposed over the buried oxide layer 12. The second capping layer 20' is traversed by the gate electrode 32'.

Figure 10C:
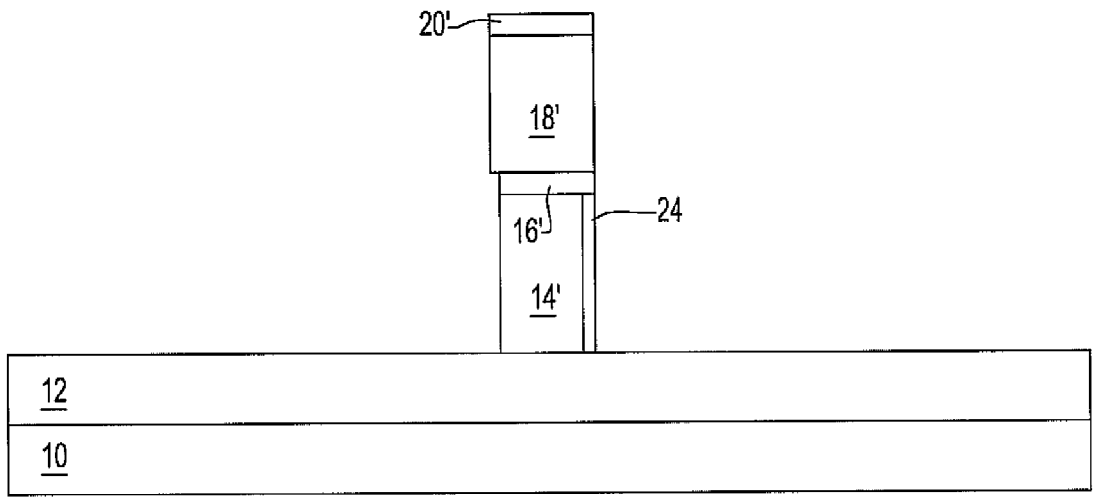

FIG. 10C shows an additional schematic cross-sectional diagram that corresponds with the schematic plan-view diagram of FIG. 10B.

FIG. 10C shows the semiconductor fin 14', the first gate dielectric 24, the first capping layer 16', the buffer layer 18' and the second capping layer 20'.

Figure 11A:
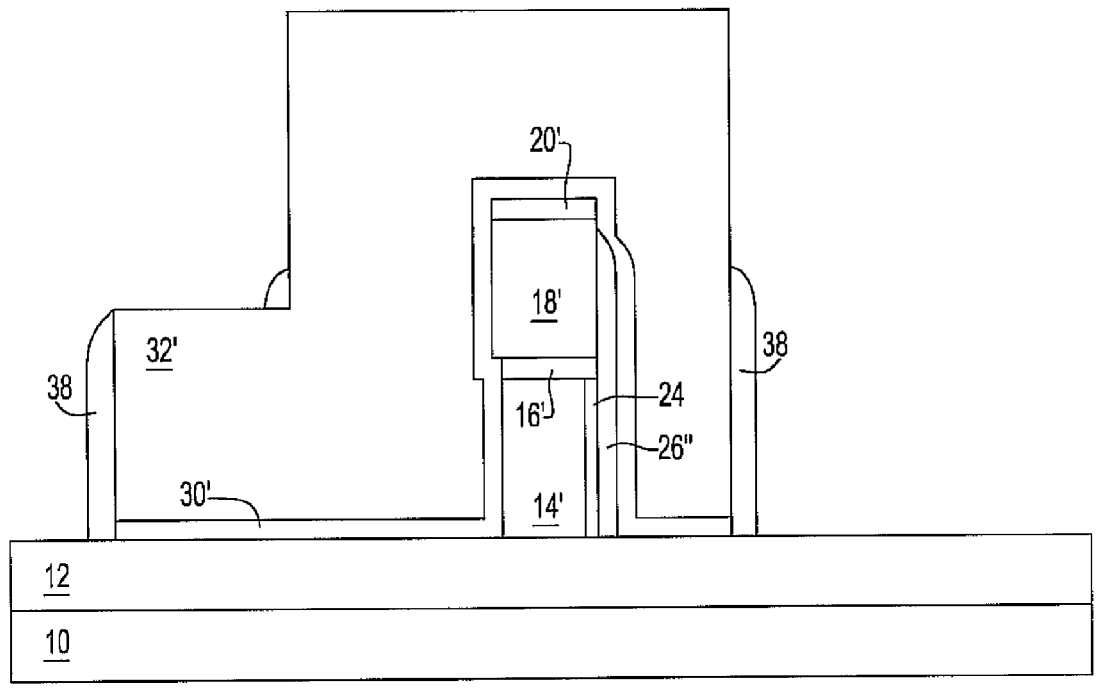
Figure 11B:
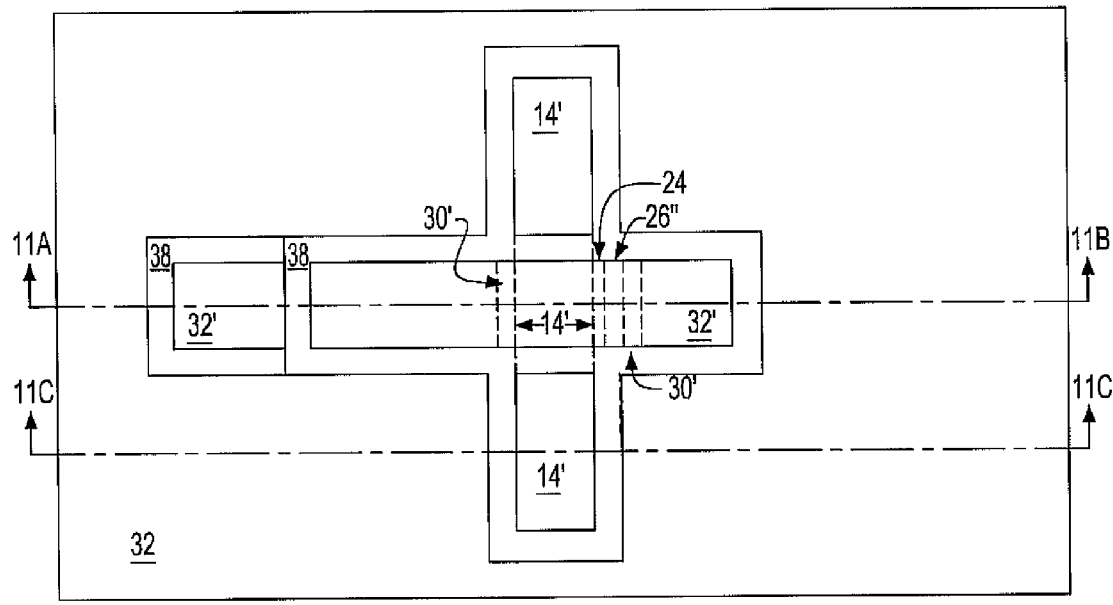
Figure 11C:
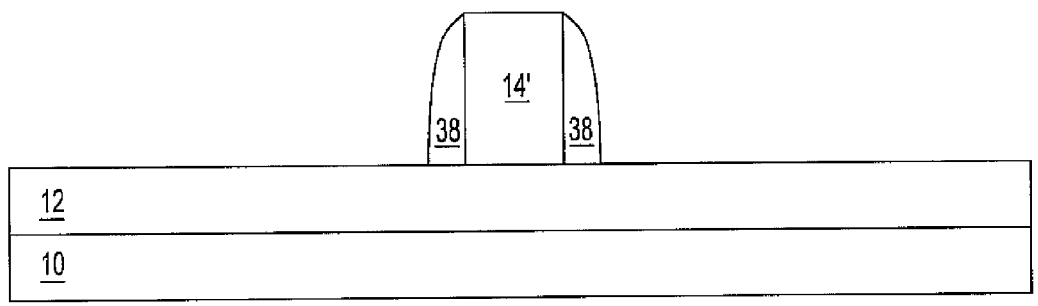

FIG. 11A, FIG. 11B and FIG. 11C show a series of schematic cross-sectional and plan-view diagrams illustrating the results of further processing of the semiconductor structures whose schematic cross-sectional and plan-view diagrams are illustrated in FIG. 10A, FIG. 10B and FIG. 10C.

FIG. 11A, FIG. 11B and FIG. 11C first show the results of stripping the second capping layer 20', the spacer layer 18' and the first capping layer 16' from portions of the semiconductor fin 14' not covered by the gate electrode 32' to leave exposed portions of the semiconductor fin 14' that serve as source and drain regions within a finfet type device. The foregoing stripping may be effected using methods and materials that are otherwise generally conventional in the semiconductor fabrication art.

FIG. 11A, FIG. 11B and FIG. 11C also show a spacer 38 located surrounding the gate electrode 32' and the semiconductor fin 14', after having stripped therefrom the layers described above. The spacer 38 may be formed using methods and materials that are otherwise generally conventional in the semiconductor fabrication art.

FIG. 11A, FIG. 11B and FIG. 11C show a series of schematic cross-sectional and plan-view diagrams illustrating a semiconductor structure in accordance with a preferred embodiment of the invention. The semiconductor structure includes a semiconductor fin 14' having a first side and a second side opposite the first side. A first gate dielectric 24 and a charge storage layer 26" are successively layered upon the first side of the semiconductor fin 14'. A second gate dielectric 30' and a gate electrode 32' are successively layered upon the second side of the semiconductor fin 14' and upon the charge storage layer 26'. The second gate dielectric 30' and the gate electrode 32' straddle the semiconductor fin 14' but the first gate dielectric 24 and the charge storage layer 26" do not straddle the semiconductor fin 14'. The charge storage layer 26" may comprise a dielectric charge storage material or alternatively a polysilicon gate electrode material that provides a floating gate. The semiconductor structure comprises a nonvolatile semiconductor structure.

The preferred embodiment is illustrative of the invention rather than limiting of the invention. Revisions and modifications may be made to methods, materials, structures and dimensions of a semiconductor structure in accordance with the preferred embodiment of the invention, while providing an embodiment in accordance with the invention, further in accordance with the accompanying claims.

What is claimed is:

1. A semiconductor structure comprising:
    a semiconductor fin located over a substrate and having a first side and a second side opposite the first side;
    a first gate dielectric located upon the first side of the semiconductor fin and a charge storage layer located upon the first gate dielectric, wherein the first gate dielectric is not located upon the second side of the semiconductor fin; and
    a second gate dielectric located upon both the second side of the semiconductor fin and the charge storage layer, and a gate electrode located upon the second gate dielectric.

2. The semiconductor structure of claim 1 wherein the charge storage layer comprises a conductor material.

3. The semiconductor structure of claim 1 wherein the charge storage layer comprises a dielectric material.

4. The semiconductor structure of claim 1 wherein the charge storage layer does not straddle the semiconductor fin.

5. The semiconductor structure of claim 1 wherein the second gate dielectric straddles the semiconductor fin.

6. The semiconductor structure of claim 1 wherein the gate electrode straddles the semiconductor fin.

7. A semiconductor structure comprising:
   a semiconductor fin located over a substrate and having a first side and a second side opposite the first side;
   a first gate dielectric located upon the first side of the semiconductor fin and a charge storage layer located upon the first gate dielectric, wherein the first gate dielectric does not straddle the semiconductor fin; and
   a second gate dielectric located upon both the second side of the semiconductor fin and the charge storage layer, and a gate electrode located upon the second gate dielectric.

8. A semiconductor structure comprising:
   a semiconductor fin located over a substrate and having a first side and a second side opposite the first side;
   a first gate dielectric located upon the first side of the semiconductor fin and a charge storage layer located upon the first gate dielectric, said charge storage layer does not straddle the semiconductor fin; and
   a second gate dielectric located upon both the second side of the semiconductor fin and the charge storage layer, and a gate electrode located upon the second gate dielectric.

* * * * *